United States Patent [19]

Hennig

[11] Patent Number: 5,298,862
[45] Date of Patent: Mar. 29, 1994

[54] METHOD FOR NUCLEAR MAGNETIC RESONANCE (NMR) TOMOGRAPHY

[76] Inventor: Jürgen Hennig, Johann-von-Weerth-Strasse 12, D-7800 Freiburg, Fed. Rep. of Germany

[21] Appl. No.: 974,395

[22] Filed: Nov. 10, 1992

[30] Foreign Application Priority Data

Nov. 13, 1991 [DE] Fed. Rep. of Germany ....... 4137217

[51] Int. Cl.$^5$ ................................................ G01V 3/00
[52] U.S. Cl. ..................................... 324/309; 324/307
[58] Field of Search ............... 324/309, 307, 300, 306, 324/312

[56] References Cited

U.S. PATENT DOCUMENTS

| | | | |
|---|---|---|---|
| 34,558,278 | 12/1985 | Young | 324/309 |
| 4,654,594 | 3/1987 | Sepponen | 324/309 |
| 4,665,367 | 5/1987 | Kramer | 324/309 |
| 4,843,322 | 6/1989 | Glover | 324/309 |
| 4,845,430 | 7/1989 | Nakabayashi | 324/309 |
| 4,908,578 | 3/1990 | Van Liere | 324/309 |
| 4,914,727 | 4/1990 | Sano et al. | 324/309 |
| 5,167,232 | 12/1991 | Parker et al. | 324/309 |

FOREIGN PATENT DOCUMENTS

3434161 3/1986 Fed. Rep. of Germany .
3504734 8/1986 Fed. Rep. of Germany .

OTHER PUBLICATIONS

"Fast Three–Dimensional Imaging of Cerebrospinal Fluid", J. Hennig et al., Magnetic Resonance in Medicine 5, 380–383 (1987). (no month).

Primary Examiner—Louis Arana
Attorney, Agent, or Firm—LaRievere & Grubman

[57] ABSTRACT

Method of measuring the nuclear magnetic resonance in selected areas of a body in order to present images of body cross-sections according to the slice-selective two dimensional Fourier-transformation. Wherein, the body is in a homogeneous magnetic field, exposed to a selection gradient and excited by a selective RF-pulse. Wherein a time-limited phase encoding gradient is applied, and finally by means of a read gradient at least one nuclear resonance signal is generated by gradient inversion in the form of at least one so-called gradient echo. Wherein, the selection gradient, the phase encoding gradient, as well as, the read gradient are arranged orthogonally with respect to one another. Wherein, RF-pulses have a high frequency excitation profile, of which the base frequencies of the high frequency differ by a value $\Delta f$ corresponding to the distance between the centers of adjacent layers or slices. Wherein different slices are excited by RF-pulses in cooperation with the selection gradient, and wherein, the amplitude and/or duration of the phase encoding gradient is varied. Slice selection frequencies for the recording of at least two phase encoding steps or groups of phase encoding steps and at most all phase encoding steps, which are allocated essentially to the same slice, differ by a frequency increment. Wherein, the allocation of the phase encoding steps to the excitation frequencies in each case is effected such that an almost continuous distribution of phase encoding steps across the measuring volume is achieved. Wherein, layers or slices which belong to a complete recording of the entire volume of the body area overlap one another in such a manner that within a random partial volume which: lies within the measuring volume, can be varied almost continuously, and has a thickness corresponding to $\delta f + \Delta f$, where $\Delta f$ corresponds to the layer distance and $\delta f$ represents the thickness of a selected layer or slice according to the bandwidth of the selective pulses.

16 Claims, 9 Drawing Sheets

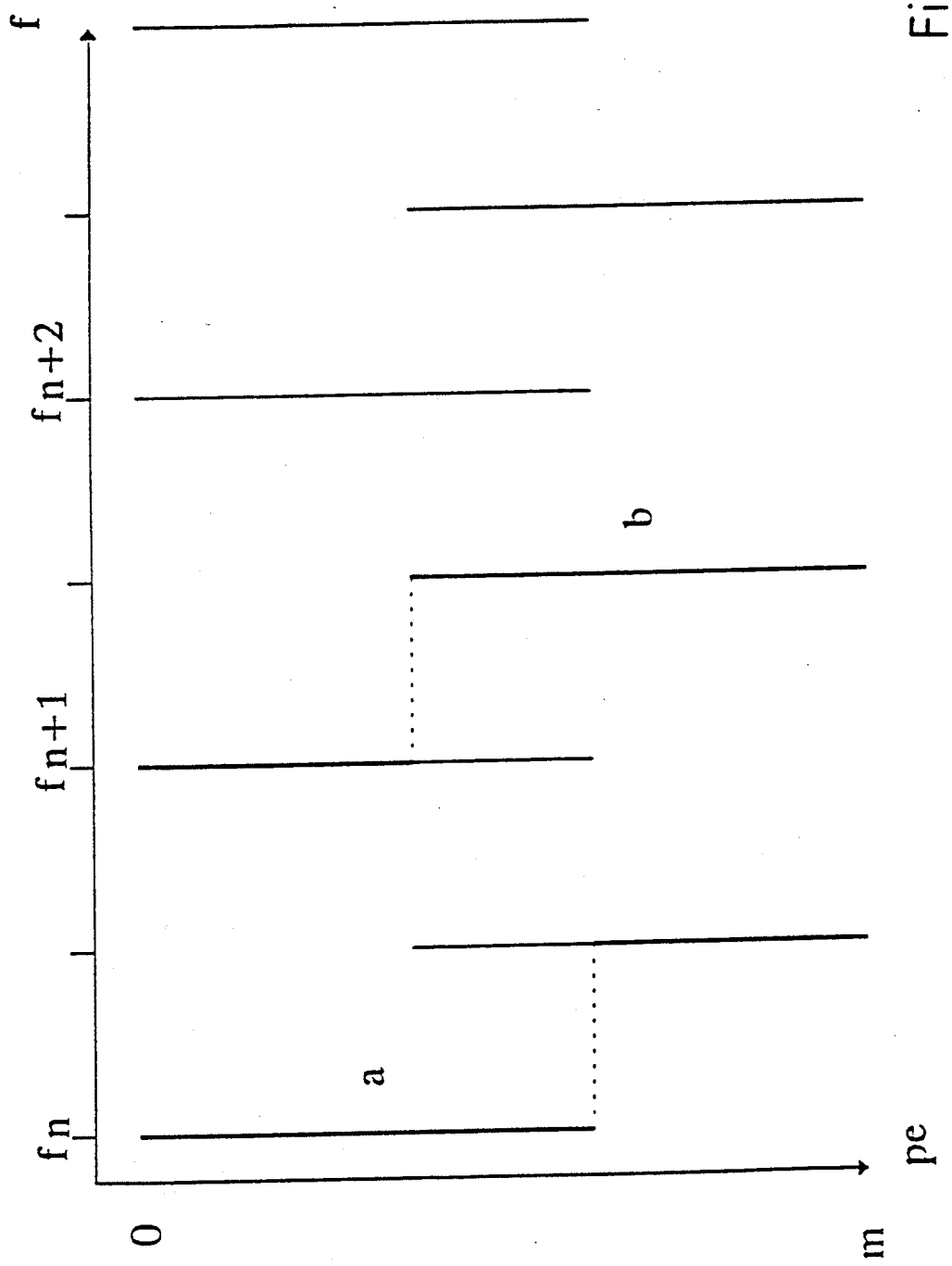

METHOD FOR NUCLEAR MAGNETIC RESONANCE (NMR) TOMOGRAPHY

The benefit of the priority date of an earlier filed copending application in the Federal Republic of Germany, application number P4137217.4, filed Nov. 13, 1991, is claimed.

BACKGROUND OF THE INVENTION

1. Field of the Invention

The present invention relates to a method of measuring the nuclear magnetic resonance in selected areas of a body. More specifically, the present invention relates to measuring the nuclear magnetic resonance in selected areas of a body to present images of body cross-sections according to a slice-selective two-dimensional Fourier-transformation method. Wherein the body is in a homogeneous magnetic field, exposed to a selection gradient and excited by a selective RF-pulse, and wherein a time-limited phase encoding gradient is applied, and at least one nuclear resonance signal by means of a read gradient is generated by gradient inversion in the form of at least one so-called gradient echo. The selection gradient, the phase encoding gradient and the read gradient are arranged orthogonally to one another. RF-pulses having a high frequency excitation profile, of which the base frequencies of the high frequency (slice selection frequency) differ by a value $\Delta f$ corresponding to the distance between the centres of adjacent layers or slices, in such a manner that different slices are excited by RF-pulses in cooperation with the selection gradient, wherein the amplitude and/or duration of the phase encoding gradient is varied.

2. Description of Related Art

In the case of conventional methods of NMR tomography a number of m individual steps containing n complex data points in each case are necessary for receiving an image of the matrix size m×n. Depending on the type of spatial encoding, the image is then generated either by two-dimensional Fourier-transformation or (less frequently) by filtered back projection. In the case of two-dimensional imaging, m individual acquisition steps are necessary for encoding the spatial information in the second image direction. If the two-dimensional Fourier-transformation is used, the magnitude of the phase encoding gradient is varied at each individual step. In which case, the term "phase encoding step" is used. The time between two individual steps for each layer defines the contrast of the image. For a typical spin echo technique in clinical applications, a repeating interval of 500 ms or more has proven to be favorable. Within this repeating interval, individual steps from several layers or slices (typically around 10–20 layers or slices) can be acquired without the need for additional time (a so-called multi-slice technique). The image recording of a relatively large volume can be carried out where each phase encoding step is performed in all layers, then the next individual step is performed in all layers by changing the phase encoding gradient, and so forth until the recording of all phase encoding steps is completed. One individual step or phase encoding step comprises the sequence of RF-pulses used for the generation of the NMR signal, as well as, the sequence of time-variant magnetic field gradients required for slice selection and spatial encoding.

A disadvantage of this method is that the slices acquired in this manner cannot adjoin one another directly due to the use of selective (i.e. narrow-band) pulses for the slice selection. These RF-pulses, even for optimum pulse forms, do not have an ideal rectangular excitation profile. To prevent overlappings, a gap between two slice profiles is necessary, as shown as waveform "a" of FIG. 1. In FIG. 1, the excitation intensity is shown on the vertical axis, and the direction of the slice selection gradient (denoted z-direction) is shown on the horizontal axis. Owing to the excitation profiles which are not ideally rectangular, areas of little image intensity are generated in the areas between two successive slices. For the diagnosis of very small lesions (for example hypophyseal adenomae), the possibility that the lesion is not scanned with the given slice coverage cannot be ignored. Therefore, it is necessary to repeat the recording by displacing it by half the width of a slice, as shown as waveform "b" of FIG. 1. In this manner the examined volume is recorded completely; however, this doubles the measuring time.

A direct complete recording of a measuring volume is possible nowadays only by using three-dimensional recording techniques. These techniques, are time intensive when using spin echo sequences which provide a diagnostically favorable image contrast; however, such techniques are overly time intensive such that application thereof is not possible in practice. Other recordings may be carried out by using known rapid imaging sequences like FLASH or RARE (Magn. Reson. Med. 5,380–383 (1987), DE 34 34 161 C2, DE 35 04 734 A1). While these imaging sequences can provide a complete representation of a measuring volume within an acceptable time period, they frequently do not have the desired contrast.

SUMMARY OF THE INVENTION

A goal of the present invention is to provide a method for carrying out a complete scanning of a measuring volume by using slow recording techniques like the spin-echo method, and thereby simultaneously maintaining a diagnostically favorable image contrast. The present invention provides slice selection frequencies for the recording of at least two phase encoding steps or groups of phase encoding steps. With the present invention, most all phase encoding steps, which are allocated essentially to the same slice, differ by a frequency increment. In the present invention, the allocation of the phase encoding steps to the excitation frequencies in each case is effected such that an almost continuous distribution of phase encoding steps across the measuring volume is achieved. In the present invention, layers or slices, which belong to a complete recording of the entire volume of the body area, overlap one another in such a manner that within a random partial volume, which lies within the measuring volume and which can be varied almost continuously, reconstruction of an image from this partial volume can be achieved by means of two-dimensional Fourier-transformation. The partial volume of the present invention has a thickness corresponding to $\delta f + \Delta f$, where $\Delta f$ corresponds to the layer distance and $\delta f$ represents the thickness of a selected layer or slice according to the bandwidth of the selective pulses.

BRIEF DESCRIPTION OF THE DRAWINGS

For fuller understanding of the present invention, reference is made to the accompanying drawing in the following detailed description of the Best Mode For Carrying Out the Invention. In the drawing:

FIG. 14 shows the k-f space trajectory for reconstruction of images at the nominal position and half-way between for the ZIP-scan in the extreme case of discrete slice advance with sampling at only two different positions.

Figure 1:
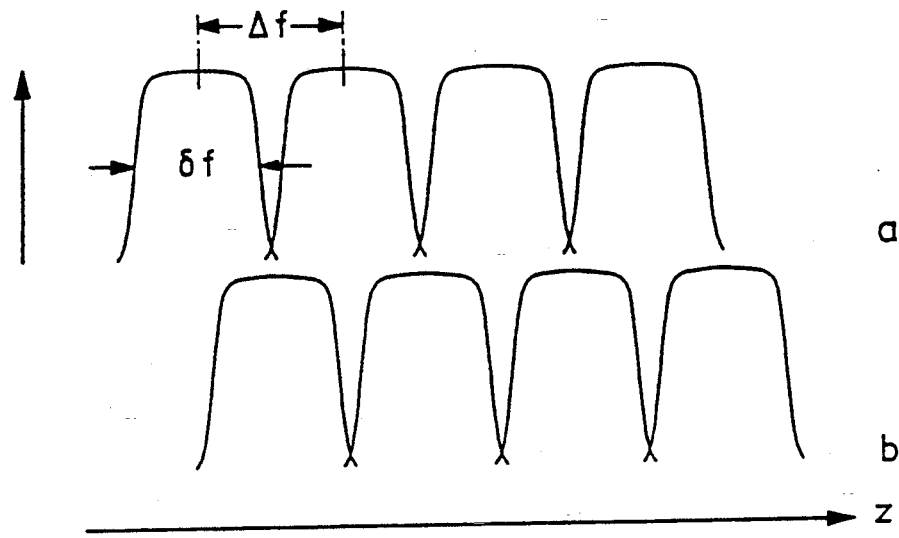
FIG. 1 shows the principle of slice selection for a multislice recording according to the prior art.

Reference numbers refer to the same or equivalent parts of the present invention throughout the several figures of the drawing.

DESCRIPTION OF THE PREFERRED EMBODIMENTS

In the method according to the present invention, a recording is carried out in m individual steps with different phase encodings in a manner similar to a conventional spin-echo technique. In known multislice technology, each of a total of k slices a slice selection is achieved using RF pulses of a certain excitation frequency, as well as, of a defined excitation width. In connection therewith, first an individual step with a defined phase encoding is carried out for each slice. Subsequently, the next phase encoding step is carried out for all slices up to the complete acquisition of all m phase encoding steps, which are required for the reconstruction of an image from each layer.

This means that the m phase encoding steps are measured at frequencies of $f_1, f_2 \ldots f_k$ for receiving k slices; wherein, the slice to slice distance as related to $\Delta f$, between two adjacent slices is generally constant. Moreover, $\Delta f$ is slightly bigger than the slice thickness defined by both the width of the excitation profile and the rate of rise of the selection gradient.

Figure 2:
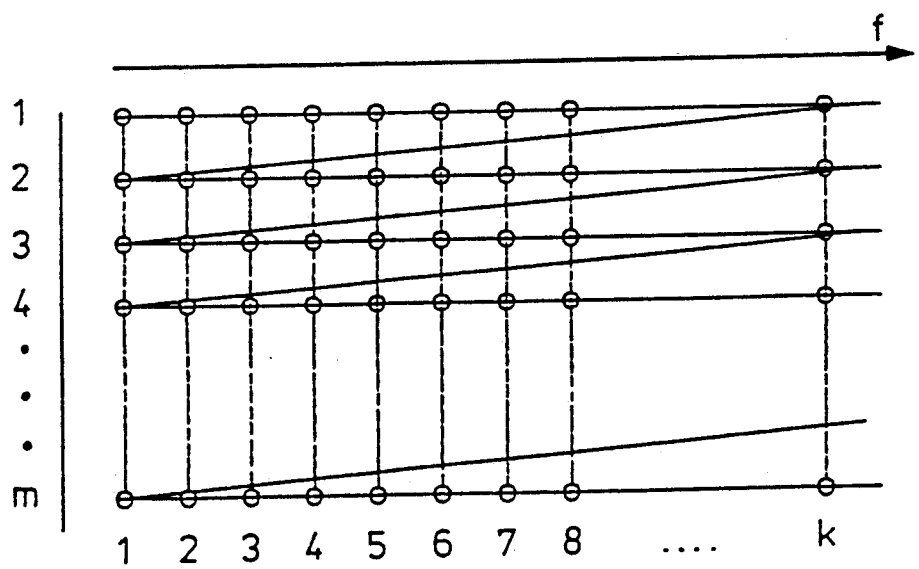
FIG. 2 shows a sequence of phase encoding steps for a multislice recording according to the prior art.

This sequence of individual steps for receiving m phase encoding steps in each case from k slices is shown in FIG. 2. The individual steps are therein indicated by small circles in each case. The straight line corresponds to the time sequence of the recording, the broken lines connect those individual steps which are used for the reconstruction of the image of the respective slice. All individual recordings of each layer are carried out to form a phase encoding step in each case. The sequence is given by the straight line which connects the points. The data is reconstructed along the broken line to form images of each layer.

The present invention does not use one single selection frequency for each phase encoding step, but the slice selection frequencies differ from one another by a frequency increment, preferably by $\Delta f/m$. Differing slice selection frequencies are used for the different phase encoding steps with respect to amplitude and/or duration, i.e., with respect to the influence on the phase of adjacent phase encoding steps.

The time sequence according to the present invention is characterized by a spin echo sequence. The most preferred time sequence is one in which individual measuring points are acquired and the slice selection frequency is varied between the acquisition of two phase encoding steps by a frequency increment. In the preferred embodiment of the present invention, the frequency increment is a constant amount $\Delta f/m$. This is graphically shown in the diagram of FIG. 3. In contrast to the normal multislice technique (FIG. 2), the recording of each phase encoding step is carried out with a spatial displacement by $\Delta f/m$. Subsequently individual layers may be reconstructed along the broken lines. Since $\Delta f/m$ for typical values of $\Delta f = 1.2 \cdot \delta f$ and $m = 256$ is very small with respect to the slice thickness $\delta f$, this result in an extremely large overlapping of the excited slices.

Thus, the following slice selection frequencies result for the m individual steps:

| | | |
|---|---|---|
| 1. $f_1$ | $f_2$ | $\ldots f_k$ |
| 2. $f_1 + \Delta f/m$ | $f_2 + \Delta f/m$ | $\ldots f_k + \Delta f/m$ |
| 3. $f_1 + 2 \cdot \Delta f/m$ | $f_2 + 2 \cdot \Delta f/m$ | $\ldots f_k + 2 \cdot \Delta f/m$ |
| . | | |
| . | | |
| . | | |
| m. $f_1 + 1(m-1) \cdot \Delta f/m$ | $f_2 + (m-1) \cdot \Delta f/m$ | $\ldots f_k + (m-1) \cdot \Delta f/m,$ | where $f_1 \ldots F_k$ are slice selection frequencies for k individual slices. Thus, a continuous distribution of phase encoding steps over a measuring volume is achieved. Now, within the coverage given by $\Delta f/m$, one image can be calculated in each case at any position within the measuring volume defined by the range $f_1$ to $f_k + (m-1) \cdot \Delta f/m$. Since, as can be seen from FIG. 3, m successive phase encoding steps contain all information in each case necessary for the reconstruction of the image. Thus, an image can be calculated, not only starting at phase encoding step 1 as it is shown by the broken lines in FIG. 3, but also starting with any random phase encoding step. As shown in FIG. 4, m phase encoding steps will give a completely defined dataset for image reconstruction. This results in a maximum number of $k \times m$ individual images which may be reconstructed from the measuring volume shifted by $\Delta f/m$ in each case. Since the entire dataset contains periodic repetitions in a spatially successive manner of the m phase encoding steps necessary for the image reconstruction, further images may be reconstructed, beginning with each encoding step. Wherein, image data is derived from areas displaced by $\Delta f/m$ in each case.

Combining the data according to the manner shown in FIG. 4, a spatial displacement by $\Delta f - \Delta f/m$ between the spatial position of the phase encoding steps of the lowest and highest excitation frequencies in each case occurs within each imaging dataset. In FIG. 4 this corresponds to the distance between phase encoding steps two and three. This may lead to image artifacts which are essentially most prominent for objects which are contained in one of the two extremely positioned slices, while not contained in the other one. Owing to the known imaging properties of two-dimensional Fourier-transformation, artifacts of this type can be formally described by a perturbation of the conjugated complex symmetry of the dataset to be reconstructed, which leads to artifacts in the direction of phase encoding.

These artifacts can be largely avoided if the maximum spatial distance between slices selected for two successive phase encoding steps is as small as possible. The sequence of the phase encoding steps may be changed depending upon the respective excitation frequencies. This is shown with reference to FIGS. 5 to 10 which show the allocation of the selection frequency to the respective phase encoding steps in a schematic manner. While only shown for one slice, this sequence is analogous for all k excited layers in each case.

Figure 4:
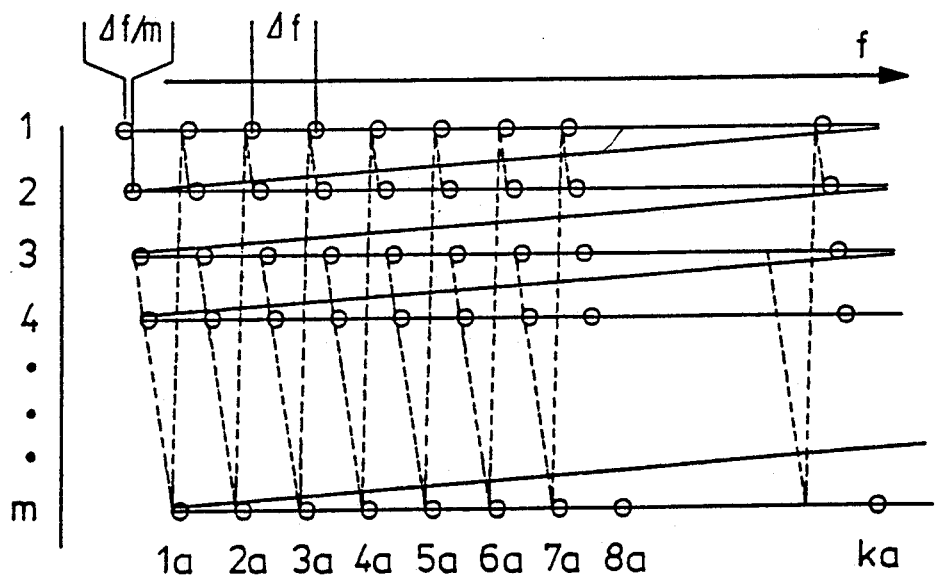
FIG. 4 shows an alternative image reconstruction method from a dataset recorded according to FIG. 3.
Figure 5:
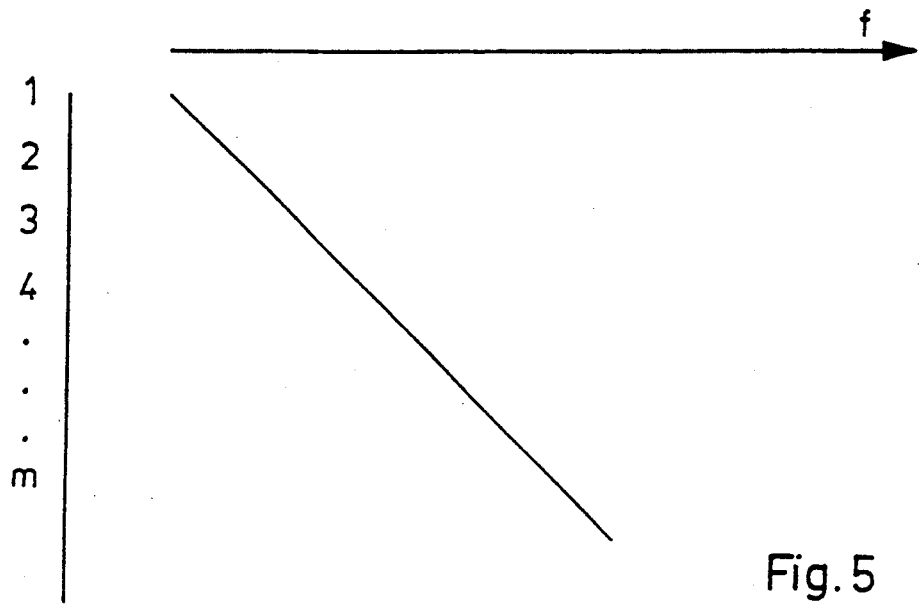
FIGS. 5-10 show simplified schemes for the representation of the sequence of the phase encoding steps dependent upon the excitation frequency selected for each step.
Figure 6:
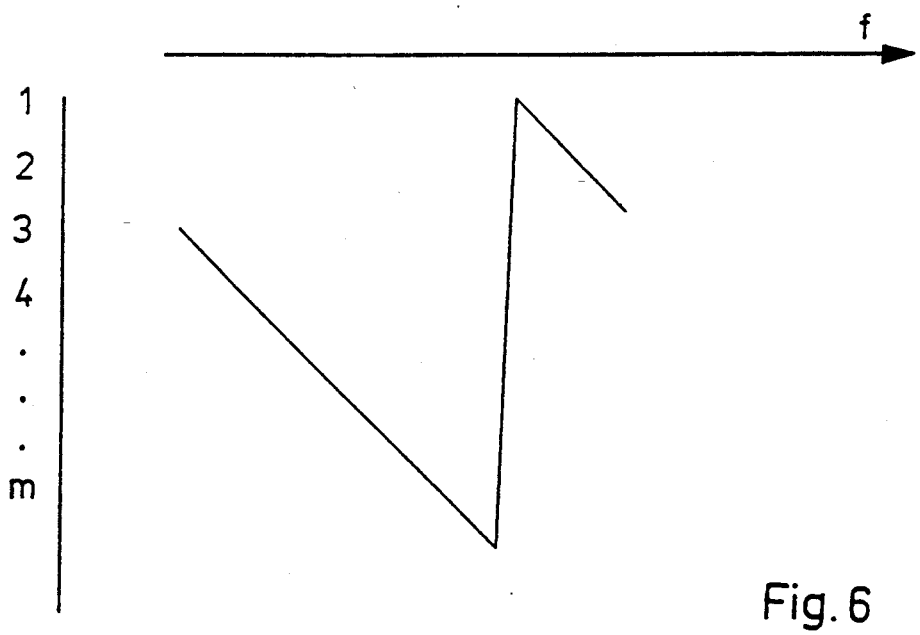

FIGS 5 to 10 show simplified schemes for the representation of the sequence of the phase encoding steps dependent upon the excitation frequency selected for each step. It should be noted that FIGS. 5 to 6 show the sequence of FIGS. 3 and 4 in a simplified manner.

Figure 3:
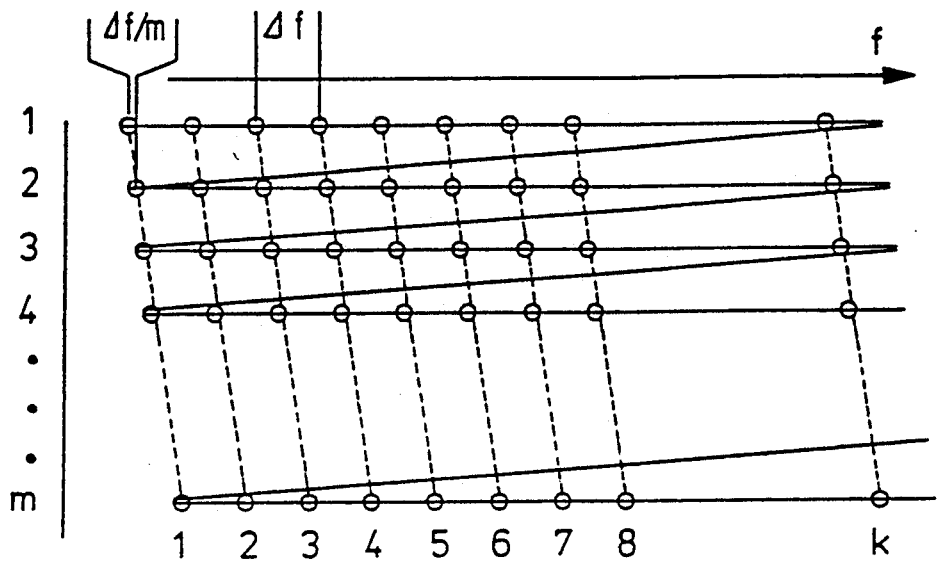
FIG. 3 shows a sequence of phase encoding steps for the method according to the present invention.

FIG. 5 corresponds to FIG. 3, wherein only one of the dotted lines in FIG. 3 is shown, and the marking of the individual steps by means of dots is left out. FIG. 6 corresponds to FIG. 4.

Figure 7:
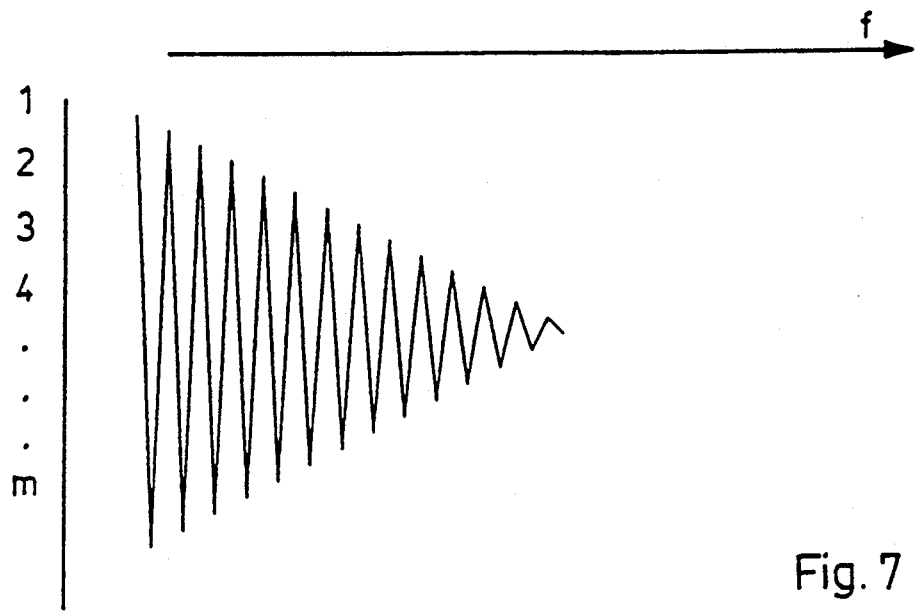
Figure 8:
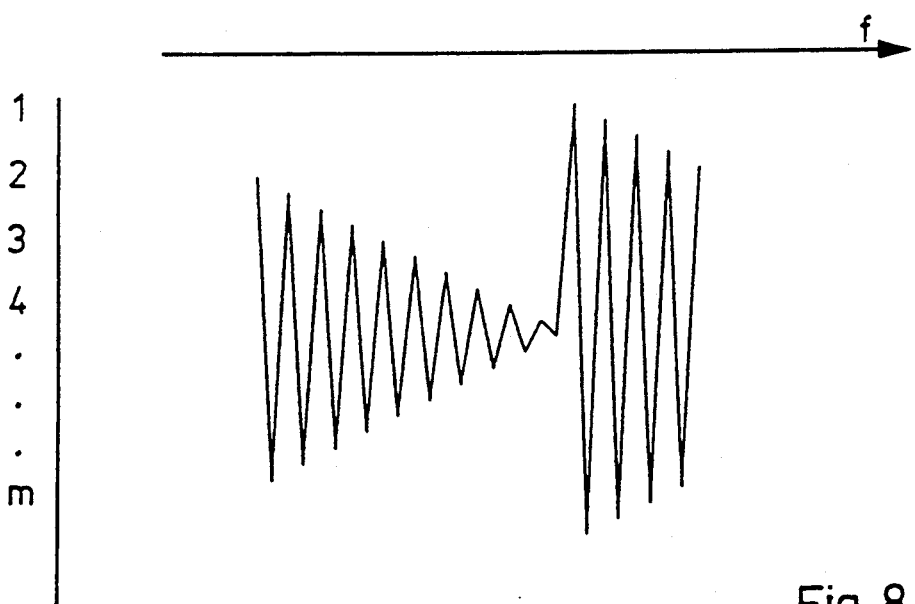
Figure 9:
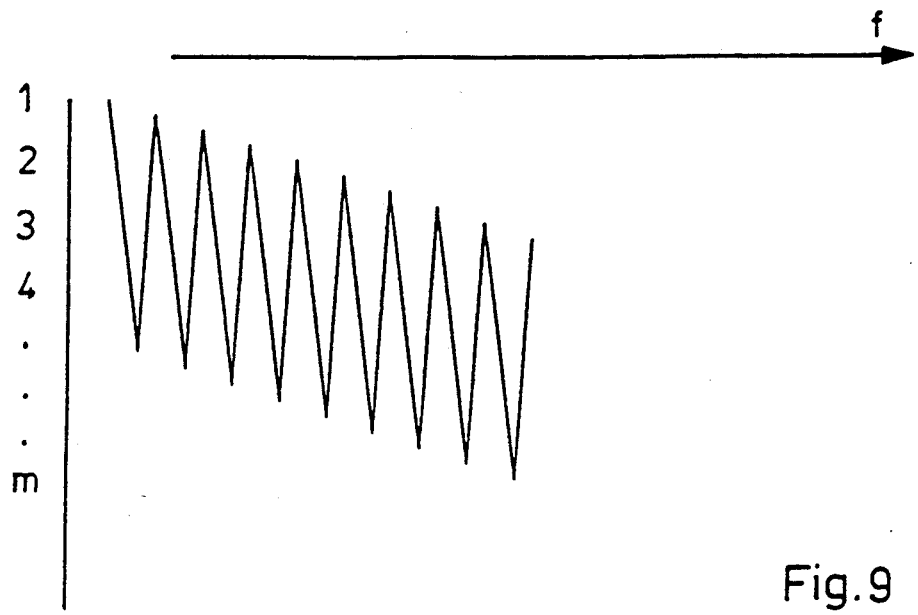
Figure 10:
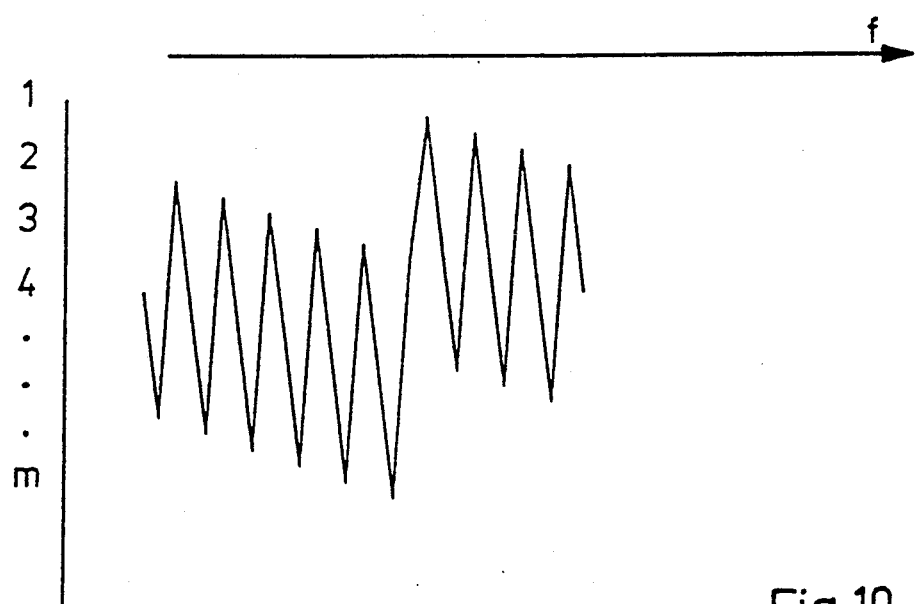

The prevention of extreme frequency leap between two successive phase encoding steps as shown in FIG. 4 and 6 are illustrated in FIGS. 7 to 10. FIG. 7 describes a sequence of phase encoding steps in the sequence $1,m,2,m-1,3,m-2 \ldots ,m/2, m/2+1$. FIG. 8 shows a cyclic permutation by changing the initial value thereof. FIG. 9 corresponds to the sequence $1,m/2+1,2, m/2+2,3, \ldots m/2,m$.

In accordance with the present invention, other sequences of allocation of phase encoding steps to respective excitation frequencies should be obvious to those with ordinary skill in the art of the present invention. These other sequences can result from the manner of handling artifacts occurring in the examination of highly structured objects in the direction of the slice selection, which seems to be favorable for a given application. In this manner, several phase encoding steps can be scanned with the same excitation frequency, as long as, the frequency increment is small compared to the slice thickness. In practice, in the case of a total of $m=256$ phase encoding steps, a partitioning of the phase encoding steps in 4 to 16 selection frequencies is considered to be sufficient for the general application.

In the extreme case partitioning only 2 partitions are provided, which leads to a sampling of data according to FIG. 14. Data is acquired only at the nominal slice selection positions $f_n$, $f_{n+1}$ .... and halfway between these positions. It is desirable to sample the projections with low order phase encoding for both partitions, because these projections contain most of the information for typical clinical examination and the prolongation of the acquisition time is generally perfectly acceptable. For example, in a typical case, 32 center projections out of a total of 256 phase encoding steps are sampled twice.

Then, of course, images cannot be reconstructed from any arbitrary position within the sampling volume, but only at the nominal positions and halfway between. If the slice-slice distance $\Delta f$ is smaller than $2 \cdot \delta f$, where $\delta f$ is the slice thickness given by the selective pulses, this will lead to an over-contiguous coverage of the sampling volume. For a multislice experiment with a nominal number of k slices within the slice selection loop, total number of $2k-1$ images will be reconstructed by reassembling data according to lines (a) and (b) in FIG. 14. Compared to a continuous ramp scan as shown in FIGS. 3 to 10, this ZIP-scan (Z-interleaved sampling of phase encoding steps) approach carries the benefit, that the volume covered by all projections used for the reconstruction of each image is given by $\Delta f/2+\delta f$, as compared to $\Delta f+\delta f$ for a continuous sampling. Partial volume effects will be thus reduced.

In the following, applications of the method according to the present invention are discussed. Additionally, as already mentioned the principle of the present invention can be applied to all common Multislice methods.

Figure 11:
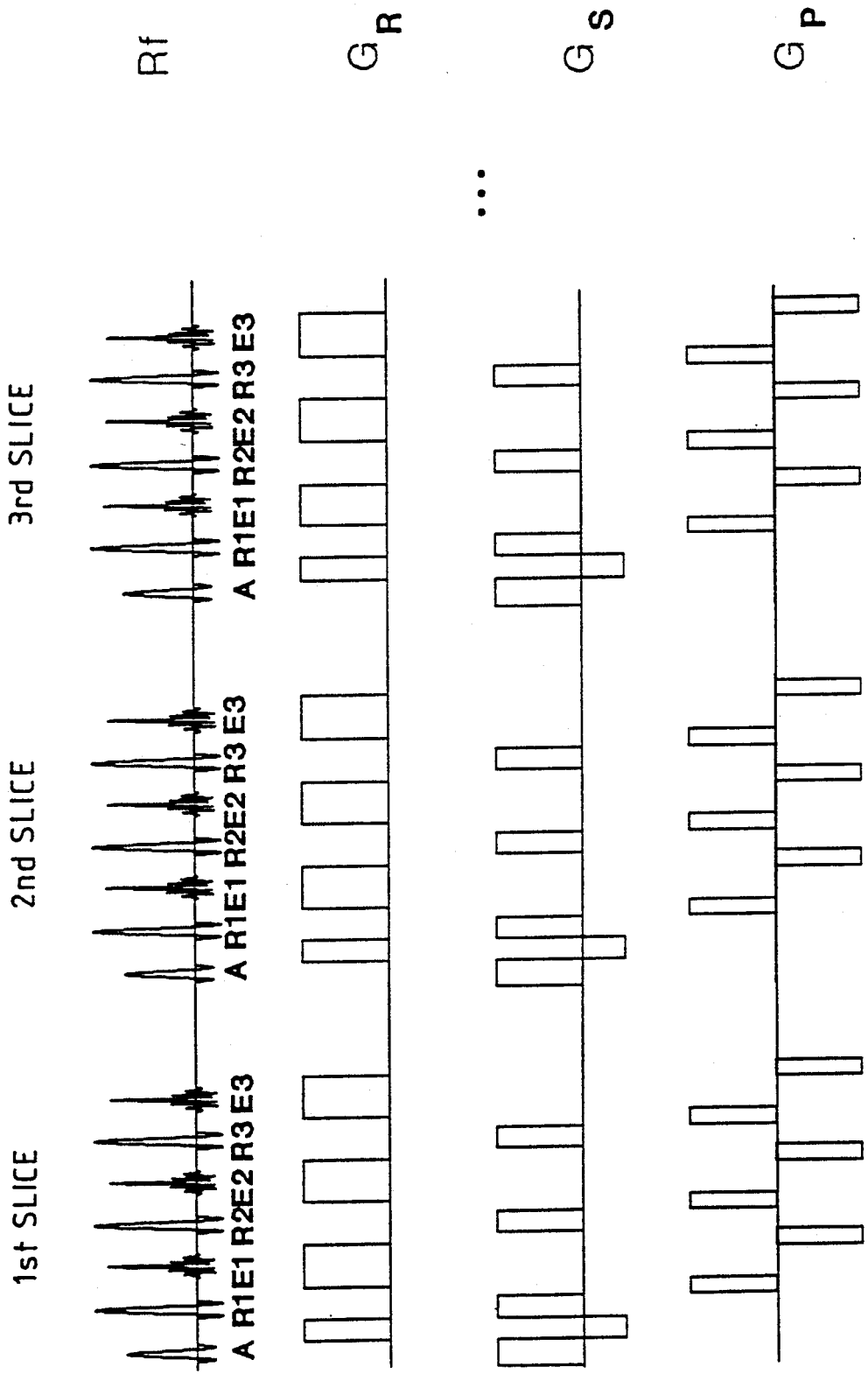
FIG. 11 shows the scheme of the multislice-multiecho sequence.

FIG. 11 shows an example of the method of the present invention with use of a known spin-echo sequence in multi-echo technique with three echoes. After a 90°-excitation pulse A by three refocusing pulses R1, R2 and R3, three echoes E1, E2 and E3 are generated in each slice in the diagram part RF (RF for Radio Frequency). $G_R$ characterizes the read gradient, $G_S$ characterizes the slice selection gradient and $G_P$ characterizes the phase gradient. In this connection, $G_P$ is varied after receiving the echoes of all slices. The selection frequencies of the pulses A, R1, R2, R3 within each layer are identical in each case and are varied from layer to layer and also from phase encoding step to phase encoding step in the manner described above. The horizontal axis is the time axis.

Figure 12:
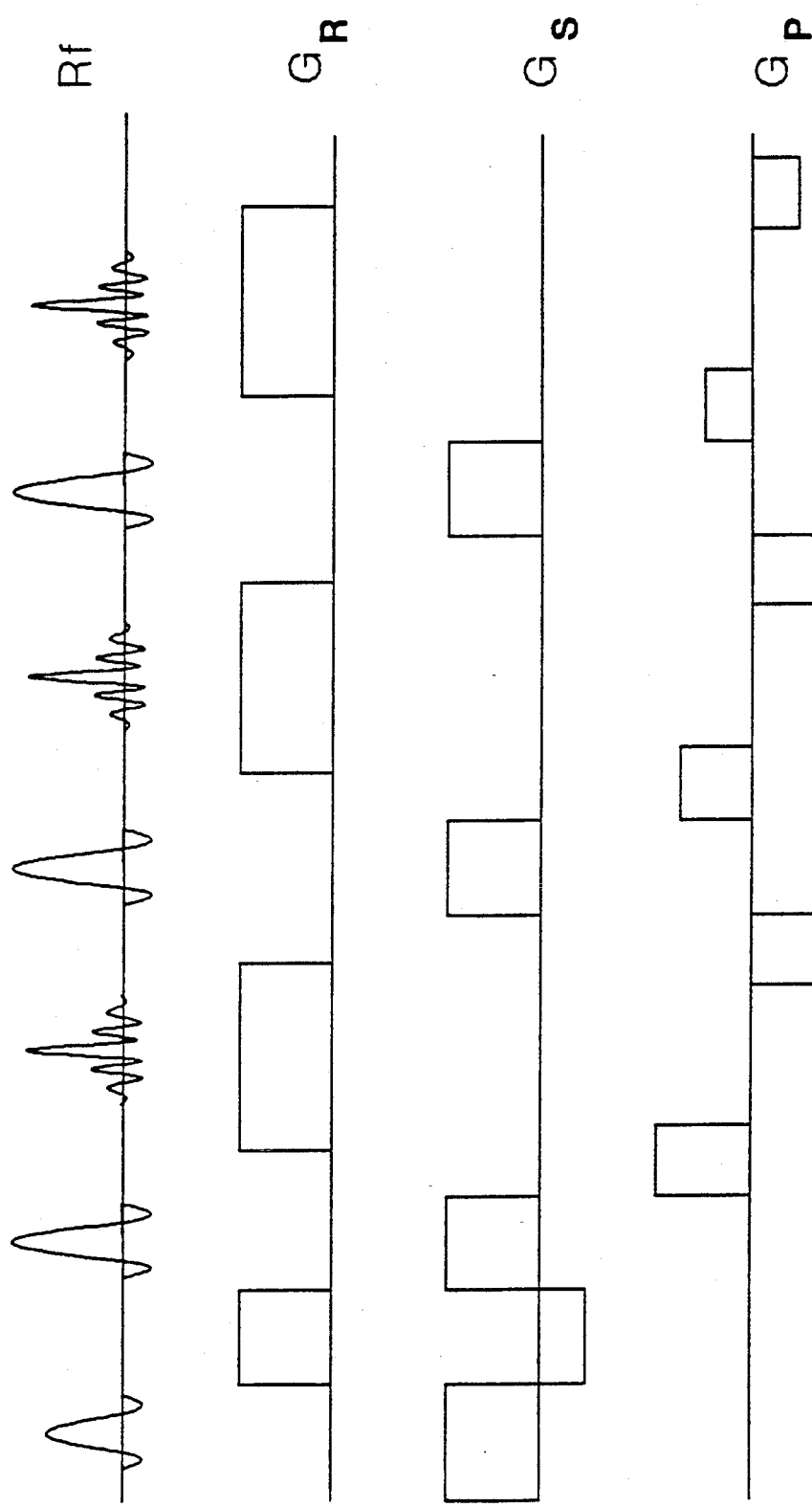
FIG. 12 shows the scheme of the RARE-sequence.
Figure 13:
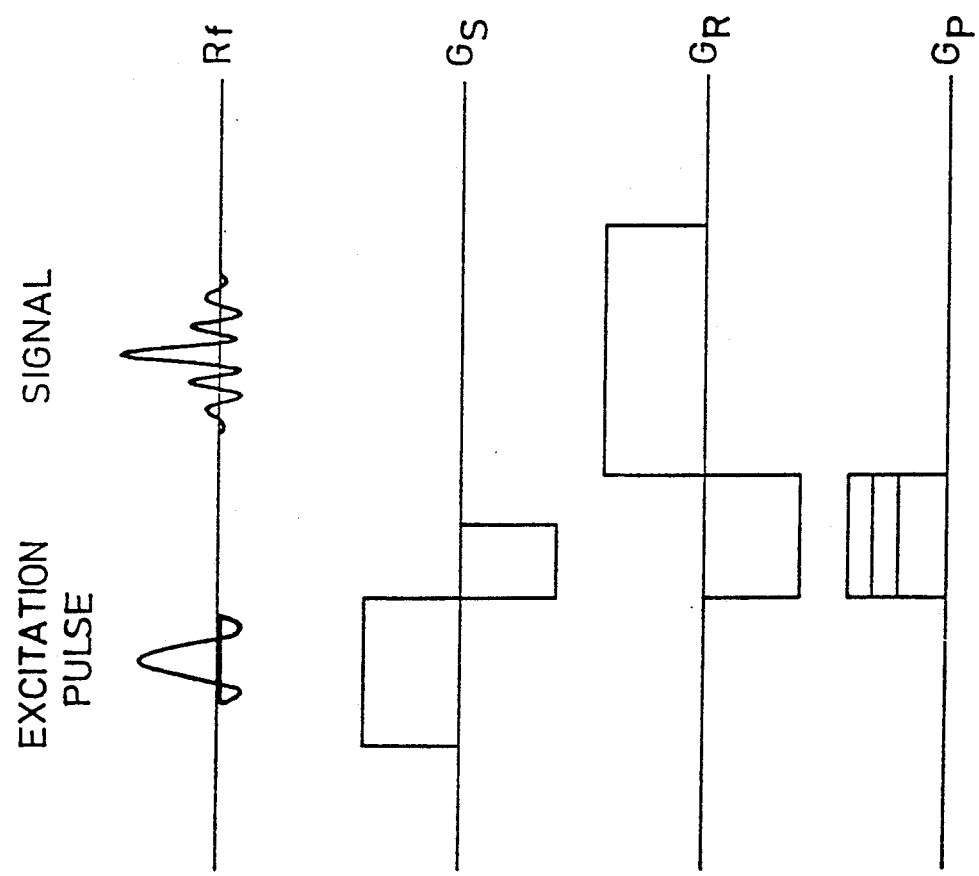
FIG. 13 shows the scheme of the gradient echo sequence.

FIG. 12 shows the RARE sequence as a further application of the method according to the present invention, in which the echoes, generated by the multi-echo method analogous to the one shown in FIG. 11, are differently phase encoded in contrast to the previous method. Since herein all refocussing pulses must also have the same frequency for the generation of echoes, the above-discussed partitioning into a maximum of m/1 partitions of different selection frequencies, wherein 1 is the number of echoes per excitation and automatically results for this method. As it is generally common in literature, FIG. 12, in contrast to FIG. 11, shows only one individual step of a slice; wherein, it is implied that this recording is also carried out in the multislice technique. This is also true for the gradient echo method shown in FIG. 13; wherein, the signal is formed not as a spin echo signal, but by inversion of the read gradient, as a so-called gradient echo.

In accordance with the present invention, in all of these image providing recording methods, a plurality k of slices lying apart from one another at a distance $\Delta f$ are excited by corresponding pulses, and after passage of all k slice in following excitations, further slices are excited by varying the phase encoding gradient, wherein the slices closely overlap the previously excited slices as described elsewhere in this specification.

In the case of intrinsically rapid recording methods, like the gradient echo method or the RARE method for example, the sequence of recording steps can be changed such that all phase encoding steps are performed after a sequence as described in FIGS. 5 to 10 or after a similar sequence therein. Wherein, the slice selection frequency is changed continuously such that two successively recorded individual steps are derived from slightly different layers. Images from multiple slices are then generated, not by an interleave of multiple slice selection steps with identical phase encoding within one phase encoding step, by a continuous advance of the selected slice with cyclic repetition of all encoded steps. This embodiment is recommended in particular for the recording of so-called Multislice-"2D-

Time-of-Flight"-angiograms, wherein the continuity of the recorded images in the direction of the read gradient is essential. Wherein, from these datasets, angiograms are to be calculated in the direction of the slice gradient (an angiogram is a representation of vessels).

Additionally, it should be noted that the described allocation of the phase encoding steps to the individual slice selection frequencies and their descriptions in the diagrams of FIGS. 5 to 10 do not necessarily have to correspond to the time sequence of the experiment. In the multislice methods for all slices in each case, all scannings which belong to a phase encoding step are carried out directly one after the other. However, the sequence of the phase encoding steps (and thus of the selection frequencies resulting from diagrams as FIGS. 5 to 10) may be varied according to the experimentator's judgement in a manner which is appropriate to the respective examination.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. The invention illustratively disclosed herein may be practiced without any element which is not specifically disclosed herein.

What is claimed is:

1. In an improved method for the measurement of nuclear spin resonance in selected regions of a body for the purpose of generating neighboring image slices through the body according to the slice-selective two-dimensional-Fourier transform method, the method consisting of a sequence of phase encoding steps in which, in one phase encoding step, the body is exposed to a homogeneous magnetic field, a selection gradient is applied, and an excitation slice through the body is generated with an RF excitation pulse, and subsequently a phase encoding gradient and a read gradient are applied, the selection gradient, the phase encoding gradient, and the read gradient being arranged orthogonally to another, so that at least one nuclear resonance echo signal is produced, the RF-excitation pulse having a high frequency excitation profile with a central frequency and a frequency band width $\delta f$ and the excitation profile of the RF pulse is so chosen that, in combination with the selection gradient, the echo signals from different excitation slices are sequentially generated, for constant phase encoding gradient, with a central frequency difference between RF-excitation pulses generating neighboring excitation slices of $\Delta f \geq \delta f$ and, subsequently, further phase encoding steps are executed with step wise change of the phase encoding gradient, the improvement comprising the steps of:

choosing at least two high-frequency excitation profiles whose central frequencies differ from each other by a frequency increment which is less than $\Delta f$;

selecting at least two phase encoding gradient steps; and assigning the two phase encoding steps to the two high frequency excitation profiles to generate phase encoding steps of one common image slice.

2. The method to claim 1, further comprising the steps of:

a) generating a plurality of neighboring excitation slices by irradiating a plurality of RF-excitation pulses whose central frequencies differ by integer multiples of $\Delta f$ under subsequent application of a common phase encoding gradient;

b) incrementing the central frequencies of the RF pulses of step a) by the frequency increment which is small compared to $\Delta f$ and selecting a phase encoding gradient which differs from that of step a); and c) repeating steps a) and b) to complete a series of phase encoding steps for imaging of neighboring image slices.

3. The method of claim 1 wherein, an echo signal is generated by means of a spin echo sequence with a production of at least one spin echo.

4. The method of claim 3 wherein, RF excitation pulses are selected using a multi-slice RARE method, high frequency excitation profiles corresponding to an echo train are constant for a single RARE method measurement, and central frequencies of high frequency excitation profiles are shifted by the amount $\Delta f$ between RARE method measurements.

5. The method of claim 1, wherein an echo signal is generated by means of a gradient echo sequence.

6. The method of claim 1 further comprising the steps of:

generating single images of neighboring image slices using a rapid image sequence procedure; and analyzing the single images to produce an MR angiogram according to a time-of-flight principle, whereby an angiogram image plane is produced which is perpendicular to a plane of the single images.

7. The method of claim 6 further comprising the step of:

maximizing a signal from flowing blood moving into a slice compared to a signal from stationary tissue in that slice by adjusting an RF-pulse flip angle and a sequence repetition time.

8. The method of claim 1 further comprising a first central frequency and a second central frequency, the second central frequency differing from the first central frequency by the frequency increment $\Delta f/2$, and at least half of the phase encoding steps are executed at both the first and the second central frequencies.

9. In an improved method for the measurement of nuclear spin resonance in selected regions of a body for the purpose of generating neighboring image slices through the body according to the slice-selective two-dimensional-Fourier transform method, the method consisting of a sequence of phase encoding steps in which, in one phase encoding step, the body is exposed to a homogeneous magnetic field, and a selection gradient is applied, and an excitation slice through the body is generated with an RF excitation pulse, and subsequently a phase encoding gradient and a read gradient are applied, the selection gradient, the phase encoding gradient, and the read gradient being arranged orthogonally to another, so that at least one nuclear resonance echo signal is produced, the RF-excitation pulse having a high frequency excitation profile with a central frequency and a frequency band width $\delta f$ and, subsequently, further phase encoding steps are executed with stepwise change of the phase encoding gradient, the improvement comprising the steps of:

selecting two high-frequency excitation profiles whose central frequencies differ from each other by a frequency increment which is less than $\delta f$;

selecting two phase encoding gradient steps; and assigning the two phase encoding steps to the two high frequency excitation profiles to generate one common image slice.

10. The method of claim 9, further comprising the step of:
exciting a plurality of neighboring slices by irradiating a plurality of RF-excitation pulses whose central frequencies differ by integer multiples of a central frequency difference, $\Delta f \geq \delta f$, between RF-excitation pulses generating neighboring excitation slices.

11. The method of claim 10 wherein, an echo signal is generated by means of a spin echo sequence with a production of a least one spin echo.

12. The method of claim 11, wherein, RF excitation pulses are selected using a multi-slice RARE method, the central frequencies of the RE excitation pulses corresponding to an echo train are constant for a single RARE method measurement, and central frequencies are shifted by the amount $\Delta f$ between RARE method measurements.

13. The method of claim 9, wherein an echo signal is generated by means of a gradient echo sequence.

14. The method of claim 10 further comprising the steps of:
generating single images of neighboring image slices using a rapid image sequence procedure; and
analyzing the single images to produce an MR angiogram according to a time-of-flight principle, whereby an angiogram image plane is produced which is perpendicular to a plane of the single images.

15. The method of claim 14 further comprising the step of:
maximizing a signal from flowing blood moving into a slice compared to a signal from stationary tissue in that slice by adjusting an RF-pulse flip angle and a sequence repetition time.

16. The method of claim 10 further comprising a first central frequency and a second central frequency, the second central frequency differing from the first central frequency by the frequency increment $\Delta f/2$ and at least half of the phase encoding steps are executed at both the first and the second central frequencies.

* * * * *